(12) United States Patent
Kurose

(10) Patent No.: US 8,728,876 B2
(45) Date of Patent: May 20, 2014

(54) METHOD OF MANUFACTURING SEMICONDUCTOR DEVICE

(71) Applicant: Semiconductor Components Industries, LLC, Phoenix, AZ (US)

(72) Inventor: Eiji Kurose, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/764,564

(22) Filed: Feb. 11, 2013

(65) Prior Publication Data

US 2013/0210200 A1 Aug. 15, 2013

(30) Foreign Application Priority Data

Feb. 15, 2012 (JP) ................................. 2012-030606

(51) Int. Cl.
*H01L 21/00* (2006.01)
(52) U.S. Cl.
USPC ............................ 438/132; 438/467; 438/678
(58) Field of Classification Search
CPC ................ H01L 23/5256; H01L 23/62; H01L 27/11206
USPC ......................................... 438/132, 467, 678
See application file for complete search history.

(56) References Cited

U.S. PATENT DOCUMENTS

| 6,033,939 A * | 3/2000 | Agarwala et al. ............. 438/132 |
| 6,555,458 B1 * | 4/2003 | Yu ................................. 438/601 |

FOREIGN PATENT DOCUMENTS

JP 5-63091 3/1993

* cited by examiner

*Primary Examiner* — Richard Booth

(57) ABSTRACT

The invention prevents a conductive fuse blown out by laser trimming from reconnecting by a plating electrode in a plating process and prevents a plating solution etc from entering a fuse blowout portion. On a semiconductor substrate of a multilayered wiring structure including a fuse blowout groove formed by blowing out a conductive fuse by laser trimming in a trimming element forming region, a second protection layer is formed so as to cover the trimming element forming region and then a plating electrode is formed on an draw-out pad electrode made of a topmost metal wiring. A third protection layer is then formed so as to cover the semiconductor substrate including the second protection layer and have an opening on the plating electrode.

20 Claims, 6 Drawing Sheets

METHOD OF MANUFACTURING SEMICONDUCTOR DEVICE

CROSS-REFERENCE OF THE INVENTION

This application claims priority from Japanese Patent Application No. 2012-030606, filed Feb. 15, 2012, the content of which is incorporated herein by reference in its entirety.

BACKGROUND OF THE INVENTION

1. Field of the Invention

The invention relates to a method of manufacturing a semiconductor device having an electroless plating electrode as a draw-out electrode, particularly a method of manufacturing a semiconductor device having a trimming element including a conductive fuse.

2. Description of the Related Art

There is a case in which a conductive fuse 55 as a trimming element is formed on a semiconductor substrate 51 as well as a device element so as to adjust the circuit characteristics etc of the element portion. FIG. 5A shows an enlarged plan view of an ordinary trimming element including a conductive fuse 55, and FIG. 5B shows a cross-sectional view of FIG. 5A along line C-C. Some of the reference numerals in FIGS. 5A and 5B will be described below referring to FIGS. 6A and 6B.

As a method of trimming by blowing out a conductive fuse 55, there are an electric current blowout trimming method in which the conductive fuse 55 is blown out by a high electric current and a laser trimming method in which the conductive fuse 55 is blown out by laser light. In either of the methods, as shown in FIG. 5B, a silicon nitride (SiN) film 59 for passivation covering the topmost surface of a semiconductor substrate 51 is removed from on the conductive fuse 55 as a trimming element by etching.

This is to avoid the following problems. In the case of the laser trimming method, when the conductive fuse 55 is covered with the SiN film 59 for passivation, the applied laser light is absorbed in the SiN film 59 to attenuate the laser light to reach the conductive fuse 55 and decrease the trimming efficiency. In the trimming method of the electric current blowout type, an escape route for the residues of the blown out conductive fuse 55 is closed, thereby leading to the reconnection of the blown out conductive fuse 55.

In this case, moisture etc that enters a trimming element forming region 70 where the SiN passivation film 59 is removed by etching may enter a region 71 where a device element such as a MOS type transistor is formed through interlayer insulation films 56 and 54 as shown by an arrow 62 in FIG. 5B and may change the characteristics of the device element, causing a problem in the reliability. The trimming element forming region 70 having a small occupation area is surrounded by the device forming region 71 having a large area.

In the trimming element forming region 70 where the conductive fuse 55 is blown out by trimming, the conductive fuse 55, the interlayer insulation films 56 and 54, etc are partially broken and allow moisture etc to enter especially easily. This is because moisture etc enters from the sidewalls of the interlayer insulation films 56 and 54 in the broken portion or the end of the broken portion extends to inside the interlayer insulation film 54 close to the semiconductor substrate 51.

A method to address this problem is disclosed in Japanese Patent Application Publication No. Hei 05-063091. FIG. 6A is an enlarged plan view of a trimming element forming region 70 and its vicinity, showing the disclosed content. In detail, the trimming element forming region 70 including a conductive fuse 55 of which the center portion is narrowed for easy blowout as a fuse blowout portion 55a is surrounded by a guard ring 58 of a metal layer, so that moisture etc entering the trimming element forming region 70, which is shown by an arrow 62, is prevented from entering the device forming region 71 as shown in FIG. 6B. The conductive fuse 55 is drawn out to the device forming region 71 surrounding the guard ring 58 through the opening 60 formed in the guard ring 58.

FIG. 6B is a cross-sectional view of FIG. 6A along line C-C. A SiN film 59 for passivation omitted in FIG. 6A is also shown. An N type epitaxial layer 52 is formed on a P type semiconductor substrate 51, and a P+ type isolation layer 53 divides the epitaxial layer 52 in the trimming element forming region 70 and an epitaxial layer 52a in the device element forming region 71.

A field oxide film 54 is formed on the P type semiconductor substrate 51 including the epitaxial layer 52 etc. Furthermore, a first metal wiring 58a is connected to the P+ type isolation layer 53 through a contact hole formed in the field oxide film 54. Furthermore, the conductive fuse 55 made of polysilicon is formed on the field oxide film 54. The fuse blowout portion 55a of the conductive fuse 55 is shown in FIG. 6B. The conductive fuse 55 is covered with an interlayer insulation film 56.

A through-hole is formed in the interlayer insulation film 56, and a second metal wiring 58b is formed so as to be connected to the first metal wiring 58a through the through-hole. The first metal wiring 58a and the second metal wiring 58b unite to form the guard ring 58. A passivation insulation film 57 having an opening is formed on the interlayer insulation film 56 etc, and the SiN passivation film 59 is further formed so as to cover the passivation insulation film 57 and have an opening on the conductive fuse 55.

As a result, as shown in FIG. 6B, moisture etc entering the trimming element forming region 70 from above the interlayer insulation film 56 on the fuse blowout portion 55a where the SiN passivation film 59 is removed by etching, as shown by an arrow 62, is blocked by the guard ring 58 of a metal layer connected to the P+ type isolation layer 53, thereby preventing the moisture etc from entering the device element forming region 71 outside the guard ring 58.

In Japanese Patent Application Publication No. Hei 05-063091, most of the trimming element including the fuse blowout portion 55a is surrounded by the guard ring 58. Therefore, even when moisture etc enters from the opening where the SiN passivation film 59 above the trimming element is removed by etching, as shown by the arrow 62 in FIG. 6B, the guard ring 58 prevents the moisture etc from entering the device forming region 71.

However, as shown in FIG. 6A, the opening 60 is formed in a portion of the guard ring 58, and the conductive fuse 55 is drawn out to the device element forming region 71 outside the guard ring 58 through the opening 60. In this case, in order to avoid a short circuit between the conductive fuse 55 and the guard ring 58 at the drawing portion, a narrow guard ring separation 60a is provided between both the side surfaces of the conductive fuse 55 and the guard ring 58.

Although narrow, this guard ring separation 60a becomes a path of moisture etc to the device element forming region 71 outside the guard ring 58, which enter from the opening in the trimming element forming region 70 where the SiN passivation film 59 is removed by etching. Although only one conductive fuse 55 is formed in FIG. 6A, there is also a case where a plurality of conductive fuses 55 are formed, and in such a case, the path of moisture to the device forming region is wider, thereby causing a problem in the reliability.

Therefore, it is necessary to realize a semiconductor device in which moisture etc does not enter the device forming region 71 from the opening in the trimming element forming region 70 where the SiN passivation film 59 is removed by etching. Particularly, when an electroless plating electrode is formed on an draw-out electrode that is the topmost layer wiring of multilayered wirings after the fuse blowout portion 55a is blown out by trimming, it is necessary to prevent the reconnection of the blown out fuse blowout portion 55a by a plating metal and prevent a plating solution etc from entering the complexly broken trimming element forming region 70, which cause a problem in the reliability.

SUMMARY OF THE INVENTION

The invention provides a method of manufacturing a semiconductor device including a conductive fuse for circuit characteristic adjustment in a trimming element forming region that includes providing a semiconductor substrate; forming a multilayered wiring structure of a polysilicon wiring and a plurality of metal wirings on a surface portion of the semiconductor substrate; forming at least one conductive fuse in a portion of the multilayered wiring structure in the trimming element forming region; forming a first protection layer having openings to expose a surface portion of an draw-out pad electrode being part of a topmost metal wiring of the multilayered wiring structure and to expose a portion of the trimming element forming region; performing a trimming to blow out the conductive fuse through the opening of the first protection layer in the trimming element forming region; forming a second protection layer covering the trimming element forming region after the trimming; forming a plating electrode on the surface portion of the draw-out pad electrode exposed in the opening of the first protection layer by an electroless plating method after the second protection layer is formed; and forming a third protection layer comprising a solder resist on the semiconductor substrate so as to expose a portion of the plating electrode.

The invention also provides a method of manufacturing a semiconductor device including a conductive fuse for circuit characteristic adjustment in a trimming element forming region that includes providing a device intermediate of which circuit characteristic has been adjusted by blowing out the fuse, the device intermediate comprising a semiconductor substrate, a multilayered wiring structure of a polysilicon wiring and a plurality of metal wirings formed on a surface portion of the semiconductor substrate, at least one conductive fuse in a portion of the multilayered wiring structure in the trimming element forming region, and a first protection layer having openings to expose a surface portion of an draw-out pad electrode being part of a topmost metal wiring of the multilayered wiring structure and to expose a portion of the trimming element forming region, the conductive fuse being disposed in the opening of the first protection layer in the trimming element forming region and being blown out for circuit characteristic adjustment; forming a second protection layer covering the trimming element forming region; forming a plating electrode on the surface portion of the draw-out pad electrode exposed in the opening of the first protection layer by an electroless plating method after the second protection layer is formed; and forming a third protection layer comprising a solder resist on the semiconductor substrate so as to expose a portion of the plating electrode.

The invention also provides a method of manufacturing a semiconductor device including a conductive fuse for circuit characteristic adjustment in a trimming element forming region that includes providing a semiconductor substrate; forming a multilayered wiring structure of a polysilicon wiring and a plurality of metal wirings on a surface portion of the semiconductor substrate; forming at least one conductive fuse in a portion of the multilayered wiring structure in the trimming element forming region; forming a first protection layer having openings to expose a surface portion of an draw-out pad electrode being part of a topmost metal wiring of the multilayered wiring structure and to expose a portion of the trimming element forming region; forming a plating electrode on the surface portion of the draw-out pad electrode exposed in the opening of the first protection layer by an electroless plating method; performing a laser trimming to blow out the conductive fuse through the opening of the first protection layer in the trimming element forming region after the plating electrode is formed; forming a second protection layer covering the trimming element forming region after the laser trimming; an forming a third protection layer comprising a solder resist on the semiconductor substrate so as to expose a portion of the plating electrode.

DETAILED DESCRIPTION OF THE INVENTION

Figure 1A:
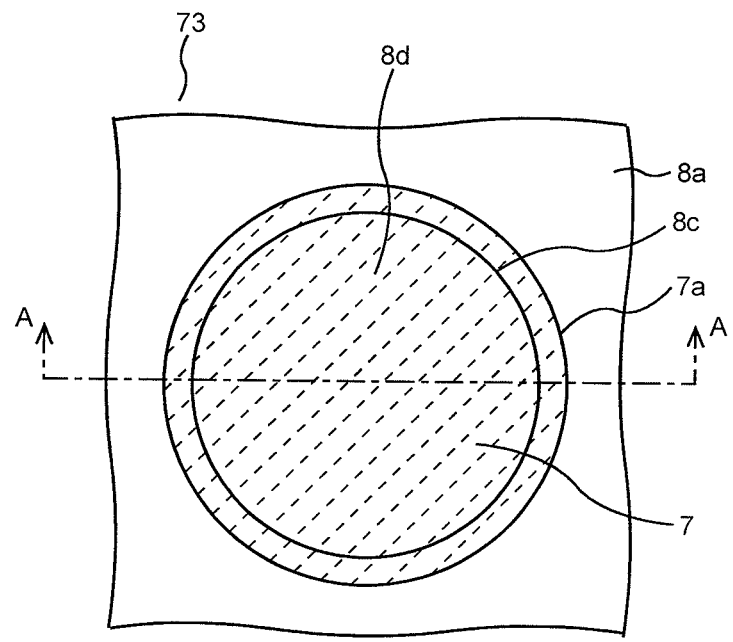
FIGS. 1A and 1B are an enlarged plan view and an enlarged cross-sectional view of a draw-out electrode and its vicinity of a semiconductor device in an embodiment of the invention.
Figure 1B:
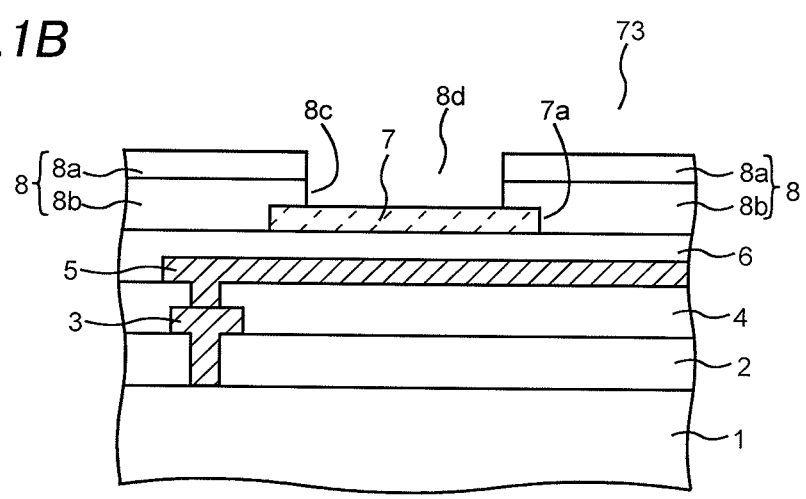
Figure 2A:
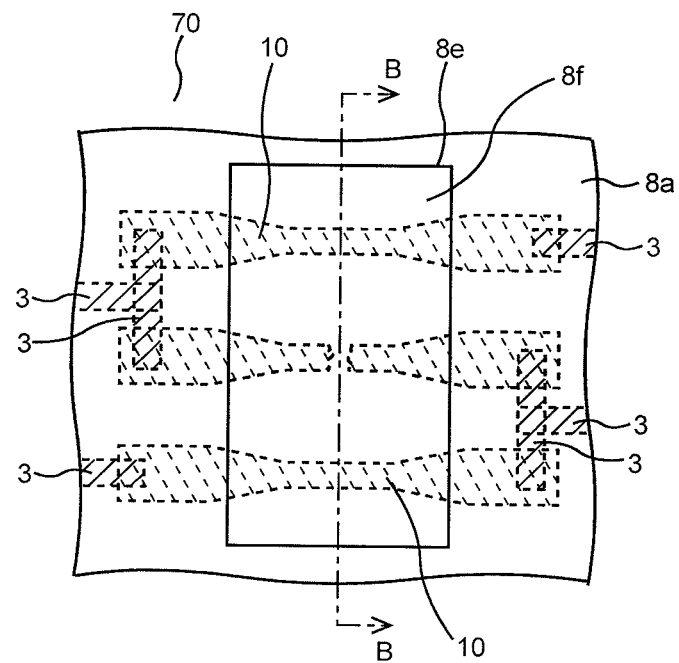
FIGS. 2A and 2B are an enlarged plan view and an enlarged cross-sectional view of a trimming element forming region, its vicinity, and a trimming portion of the semiconductor device in the embodiment of the invention.
Figure 2B:
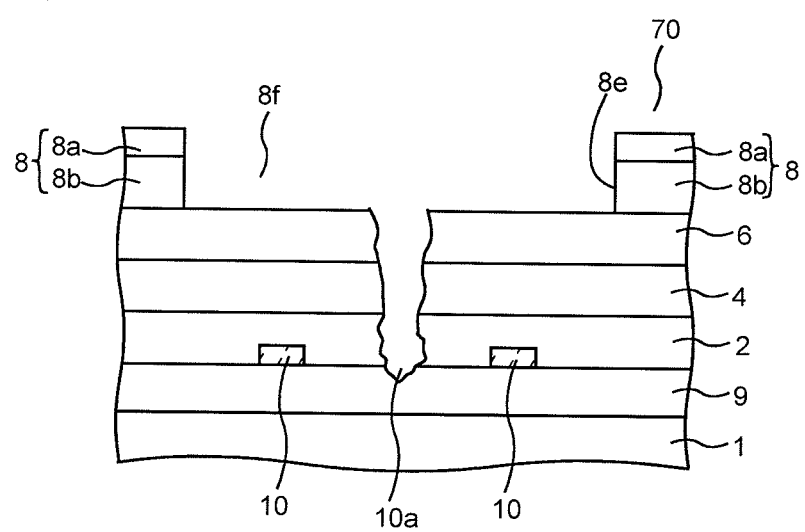

A method of manufacturing a semiconductor device of an embodiment includes a front-end process from starting a process of manufacturing a semiconductor substrate to completing a laser trimming process and a post-process in which processes subsequent to the laser trimming process are performed. FIGS. 1A, 1B, 2A and 2B show plan views and cross-sectional views of a semiconductor substrate that completes the laser trimming process. FIG. 1A is an enlarged plan view of a draw-out electrode vicinity region 73, and FIG. 1B is a cross-sectional view of FIG. 1A along line A-A. FIG. 2A is an enlarged plan view of a trimming element forming region 70, and FIG. 2B is a cross-sectional view of FIG. 2A along line B-B. In each of the cross-sectional views, for only understanding the substance of the embodiment, only a multilayered wiring structure etc on a semiconductor substrate 1 are shown, and structures in the semiconductor substrate 1 such as various types of diffusion layers etc are omitted.

The front-end process from starting the process of manufacturing the semiconductor substrate 1 to completing the laser trimming process will be briefly described hereafter referring to FIG. 1B. Device elements etc necessary for a semiconductor device selected from various types of device elements including a MOS type transistor and a bipolar type transistor are formed in the semiconductor substrate 1. For this, a P type semiconductor layer, an N type semiconductor layer and a PN isolation layer are formed in a portion of the semiconductor substrate 1 by a predetermined ion implantation method or a thermal diffusion method. Furthermore, according to needs, an epitaxial layer, a gate insulation film, a gate electrode, an element isolation insulation film, etc are formed by predetermined methods.

Then, an insulation film 2 is formed on the semiconductor substrate 1 by a predetermined thermal oxidation method, a CVD method, or the like, and a contact hole is formed in the insulation film 2 by a predetermined photo-etching process. Aluminum (Al) or the like filling the contact hole and covering the insulation film 2 is then deposited by a sputtering method or the like, and a predetermined photo-etching process is performed to form a first metal wiring 3. The contact hole may be filled with tungsten (W) or the like by a CVD method or the like.

Then, a first interlayer insulation film 4 is formed by a predetermined process so as to have a through-hole in a predetermined portion on the first metal wiring 3. A second metal wiring 5 is then formed on the first interlayer insulation film 4 by a predetermined method so as to fill the through-hole. A second interlayer insulation film 6 is further formed so as to cover the second metal wiring 5, and a draw-out pad electrode 7 with a pad electrode end portion 7a made of a third metal wiring is formed on the second interlayer insulation film 6 by a predetermined method.

A multilayered wiring structure is further formed according to needs, and in this case the draw-out pad electrode 7 is made of the topmost layer metal wiring. The draw-out pad electrode 7 is connected to the second metal wiring 5 etc through a through-hole formed in the second interlayer insulation film 6 etc. The through-hole may be filled with tungsten (W) or the like as described above.

Then, a first protection layer 8 as a passivation film is formed by a CVD method or the like. In the embodiment, the first protection layer 8 has a two-layered structure of a silicon oxide passivation film 8b as a lower layer and a silicon nitride passivation film (SiN) 8a as an upper layer. Then, a predetermined photo-etching process is performed to the first protection layer 8 to form an opening 8d with an opening end 8c that exposes a portion of the draw-out pad electrode 7.

Next, a method of manufacturing the trimming element forming region 70 will be described referring to FIGS. 2A and 2B. In principle, the components in the trimming element forming region 70 shown by the same reference numerals as in the draw-out electrode vicinity region 73 shown in FIG. 1B etc are formed at the same time as when the components in the draw-out electrode vicinity region 73 are formed. A conductive fuse 10 may be made of the first metal wiring 3 or the second metal wiring 5 shown in FIG. 1B.

In this case, it is preferable to form the conductive fuse 10 using a metal wiring as upper as possible. This is because the conductive fuse 10 formed closer to the front surface is blown out by laser light more easily to reduce the load of the laser device. In the case of FIG. 1B, it is preferable to form the conductive fuse 10 using the second metal wiring 5.

In the embodiment, the conductive fuse 10 formed in the trimming element forming region 70 is made of polysilicon, polysilicon silicide, or the like. In this case, the conductive fuse 10 is formed on an element isolation insulation film 9 of LOCOS (Local Oxidation of Silicon) formed between the insulation film 2 and the semiconductor substrate 1 by a predetermined method. One conductive fuse 10 or a plurality of conductive fuses 10 is formed according to needs.

FIG. 2A shows a case of three conductive fuses 10. Each of the conductive fuses 10 is formed so as to be wide in both the ends and narrow in the center portion for easy blowout. The three conductive fuses 10 are connected to each other in series through the first metal wiring 3 or the like. The end portions of the conductive fuses 10 are connected to a circuit for trimming adjustment through the first metal wiring 3 or the like.

An opening is formed in the first protection film 8 in the trimming element forming region 70 by a predetermined method at the same time as when the opening shown in FIG. 1B etc is formed, as an opening 8f with an opening end 8e. The area of the opening 8f of the first protection layer 8 in the trimming element forming region 70 shown in FIG. 2A is small and below 1% of the area of the opening 8d of the first protection film 8 on the draw-out pad electrode 7 shown in FIG. 1A. Because the occupied area by the center portion of the conductive fuses 10 may be small for easy blowout.

After the openings 8d and 8f are formed in the first protection film 8 as shown in FIGS. 1B and 2B, the circuit characteristics etc are measured. When it is judged that trimming for circuit characteristic adjustment is necessary, laser light is applied to a predetermined one of the conductive fuses 10 from the opening 8f of the first protection layer 8 in the trimming element forming region 70 so as to blow out the conductive fuse 10.

The amount of laser light absorbed in the interlayer insulation film 6 etc made of a silicon oxide film etc is small, and most of the laser light is absorbed in the conductive fuse 10 made of polysilicon or the like. As a result, the temperature of a portion of the conductive fuse 10 applied with the laser light increases, and finally the conductive fuse 10 is blown out to form a fuse blowout groove 10a.

By inner thermal stress at the time, cracks occur in the interlayer insulation films 4 and 6 and the insulation film 2 above the fuse blowout groove 10a, and cracks also occur in a portion of the element isolation insulation film 9 under the fuse blowout groove 10a. The cracks are various including such large cracks as to blow the interlayer insulation film 4 etc above the fuse blowout groove 10a as shown in FIG. 2B or micro cracks. Then, a non-defective or defective judgment is made to each of the semiconductor dies by a tester and the front-end process is ended, and then the semiconductor substrate 1 formed with the plurality of semiconductor dies including the trimmed semiconductor die is sent to the post-process.

Figure 3:
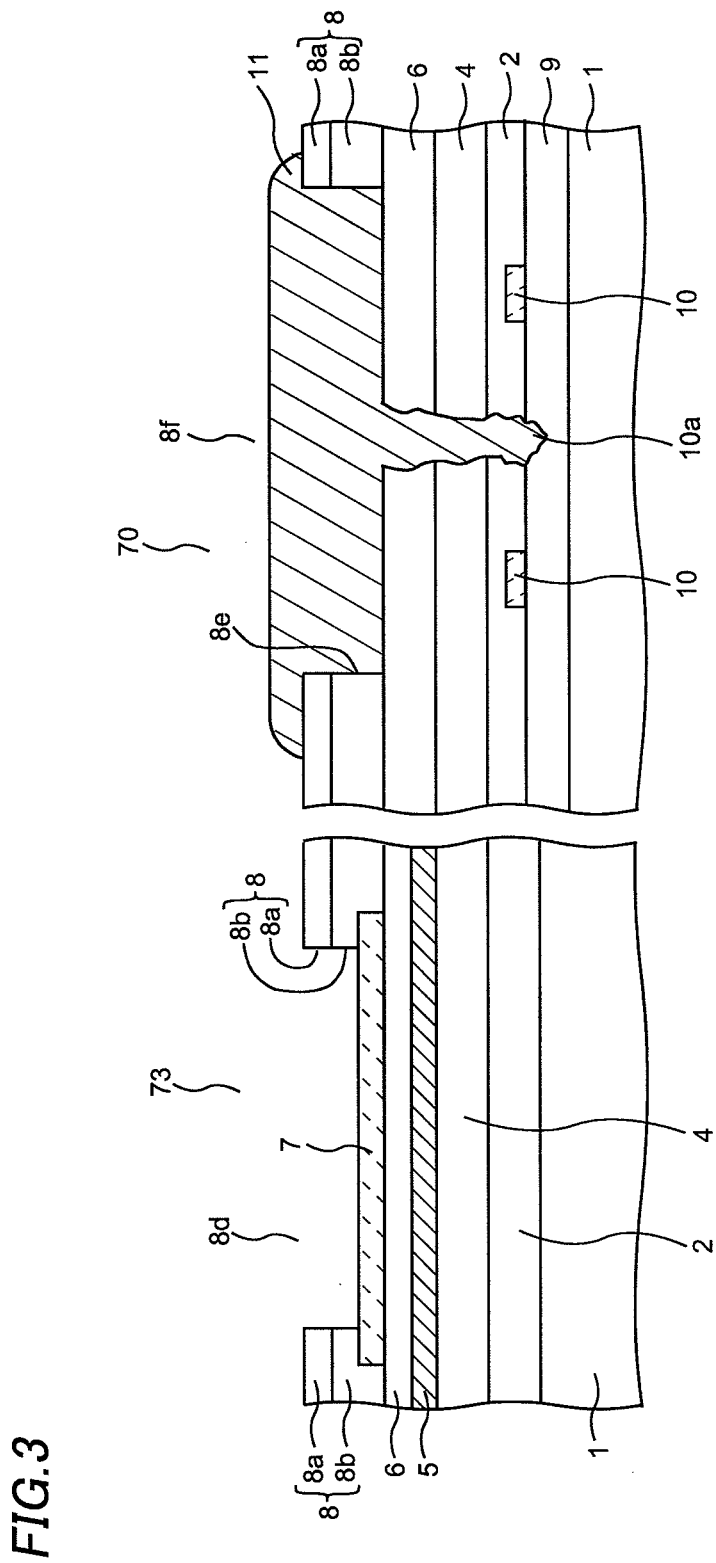
FIG. 3 is a cross-sectional view of a main portion showing a method of manufacturing the semiconductor device in the embodiment of the invention.

FIG. 3 shows an enlarged cross-sectional view of the draw-out electrode vicinity region 73 and the trimming element forming region 70 of the semiconductor substrate 1 formed with the plurality of semiconductor dies that completes the front-end process, the regions 73 and 70 being separately aligned by different magnifications for comparison. As described above, the area of the opening 8f of the first protection layer 8 in the trimming element forming region 70 is small and below 1% of the area of the opening 8d of the first protection layer 8 on the draw-out electrode 7. Therefore, if the draw-out electrode vicinity region 73 and the trimming element forming region 70 are not shown with difficult magnification, the structure of the trimming element forming region 70 is difficult to be recognized as the area of the opening 8f of the first protection layer 8 in the trimming element forming region 70 is too small.

In the post-process, first, a solder resist made of photosensitive polyimide or the like for forming the second protection layer 11 is coated on the whole surface of the semiconductor substrate 1 that completes the front-end process by spin-coating or other predetermined method. The solder resist also enters the fuse blowout groove 10a of the conductive fuse 10 and fills the fuse blowout groove 10a.

The fuse blowout groove 10a includes complexly intricate fine pores formed in the interlayer insulation film 10 etc as described above. In order to fill the fuse blowout groove 10a including such pores with the second protection layer 11, it is necessary to flow the solder resist into the pores enough.

Therefore, it is preferable that the solder resist as the material of the second protection layer 11 has lower viscosity than a third protection layer 13 covering the second protection layer 11 that will be described below. Furthermore, since the fuse blowout groove 10a extends to a region close to the semiconductor substrate 1, it is preferable that the second protection layer 11 has lower impurity concentration and higher purity than the third protection layer 13.

Then, exposure and development are performed to the solder resist using a predetermined mask to form the second protection layer 11 covering the opening 8f of the first protection layer 8 in the trimming element forming region 70. The end portion of the second protection layer 11 is extended beyond the end portion 8e of the first protection layer 8. It is preferable that the extended width is narrow but such that the opening 8f is not exposed from the second protection layer 11 by mask misalignment. If the extended width is too wide, the coated third protection layer 13 made of a solder resist does not become uniform.

From this aspect, it is preferable that the second protection layer 11 is thin but such that it fills the opening 8f of the first protection layer 8. To this end, there is a method in which a mask pattern for forming the second protection layer 11 is made of a material having a predetermined transmittance to exposure light. Using this mask, half-exposure is performed to the solder resist in the mask pattern portion, and by development the second protection layer 11 of a desired thickness corresponding to the transmittance is formed.

Alternatively, the second protection layer 11 may be formed on the whole surface except on the draw-out pad electrode 7 exposed in the opening 8d of the first protection layer 8 in the draw-out electrode forming region 73. In this case, the third protection layer 13 covering the second protection layer 11 is formed thin by that amount, and thus the use amount of the solder resist is decreased.

The second protection layer 11 may be made of other material than a solder resist, a silicon insulation film. For example, the second protection layer 11 may be formed by depositing a silicon oxide film or the like on the semiconductor substrate 1 by a CVD method and performing a predetermined photo-etching process. In this case, it is preferable that the second protection layer 11 is made of a silicon nitride film from an aspect of preventing moisture etc from entering. SOG may be coated on the semiconductor substrate 1 by spin-coating or the like to fill the fuse blowout groove 10a in the trimming element forming region 70.

Figure 4:
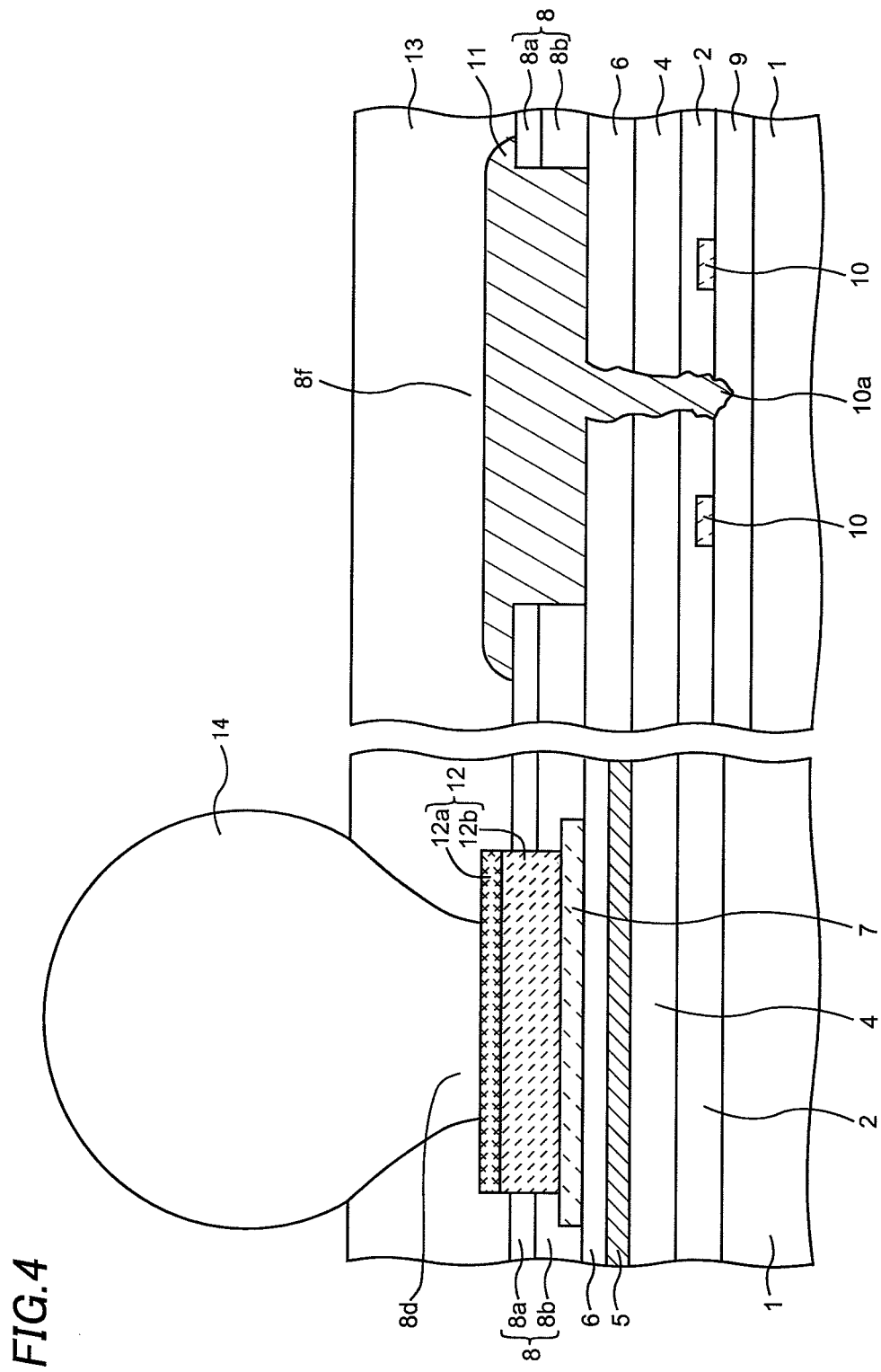
FIG. 4 is a cross-sectional view of a main portion showing the method of manufacturing the semiconductor device in the embodiment of the invention.
Figure 5A:
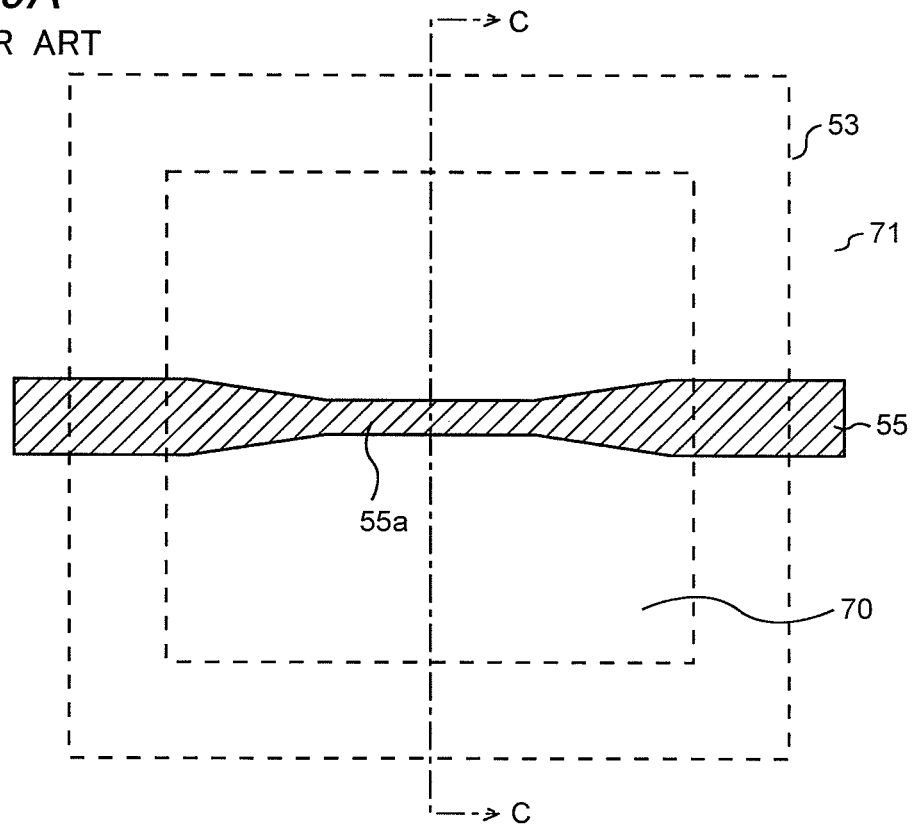
FIGS. 5A and 5B are an enlarged plan view and an enlarged cross-sectional view of a trimming element forming region, its vicinity, and a path of moisture etc of a conventional semiconductor device.
Figure 5B:
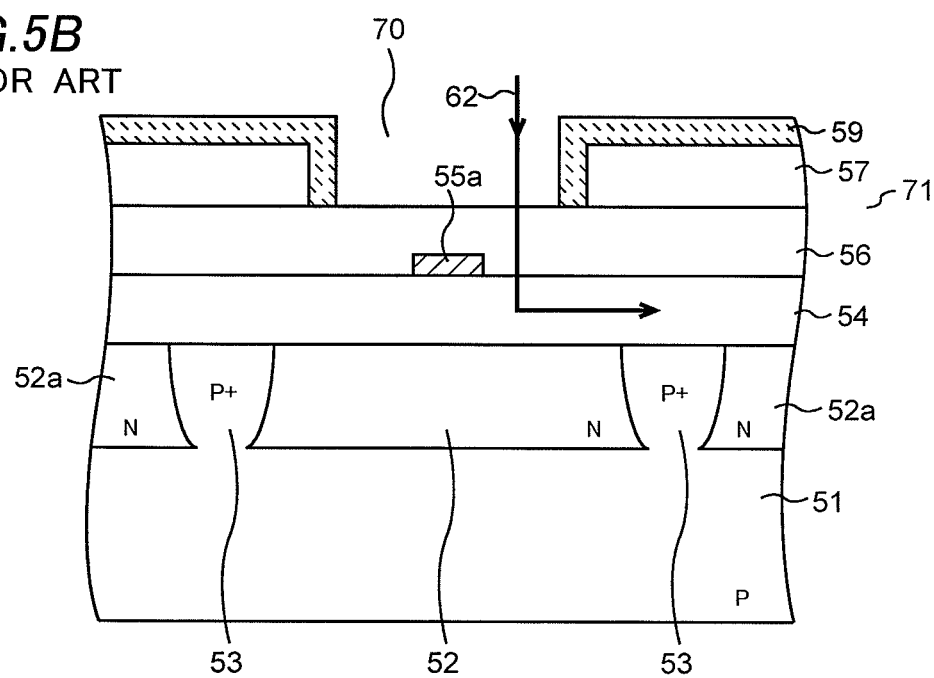
Figure 6A:
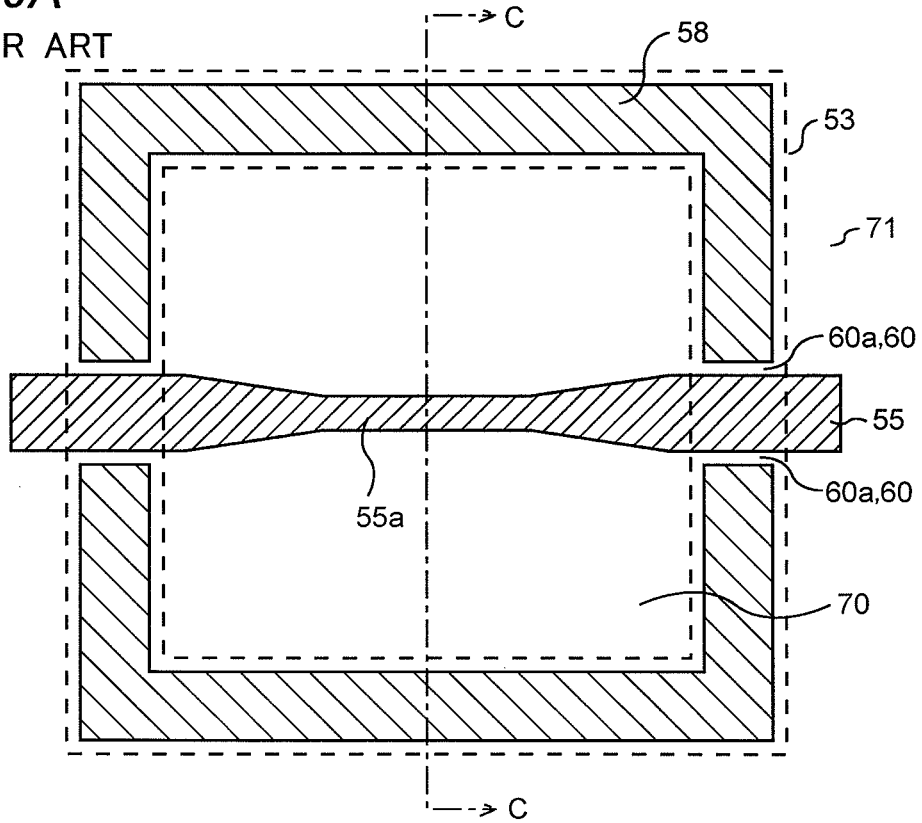
FIGS. 6A and 6B are an enlarged plan view and an enlarged cross-sectional view of a trimming element forming region, its vicinity, and a path of moisture etc of a semiconductor device disclosed in Japanese Patent Application Publication No. Hei 05-063091.
Figure 6B:
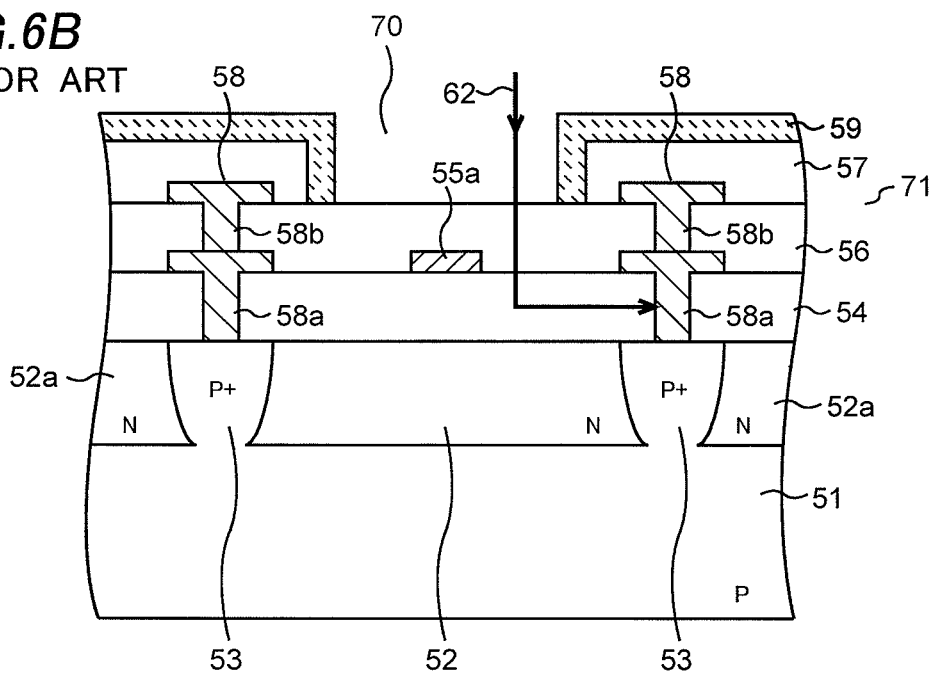

Then, as shown in FIG. 4, a plating electrode 12 is formed on the draw-out pad electrode 7 exposed in the opening 8d of the first protection layer 8 in the draw-out electrode forming region 73. The plating electrode 12 is formed by degreasing the semiconductor substrate 1 formed with the second protection layer 11 or the like and then forming a nickel (Ni) plating layer 12b having a predetermined thickness on the draw-out pad electrode 7 and a gold (Au) plating layer 12a having a predetermined thickness on the nickel plating layer 12b by a predetermined electroless plating method.

Then, as shown in FIG. 4, a solder resist made of photosensitive polyimide or the like as the material of the third protection layer 13 is coated on the whole surface of the semiconductor substrate 1 including on the second protection layer 11 by a predetermined method such as spin coating. Then, a predetermined photolithography process is performed to form the third protection layer 13 having an opening on the plating electrode 12. The third protection layer 13 is formed to have a large thickness of about 10 μm so as to obtain the high sealing effect for the semiconductor device.

Then, an external bump electrode 14 is formed on the plating electrode 12 exposed in the opening of the third protection layer 13 by solder plating, solder screen printing or the like and then a heat treatment. The material of the external bump electrode 14 may be others such as gold (Au). Finally, the semiconductor substrate 1 is diced along a scribe line to complete individual semiconductor devices.

In the embodiment, the fuse blowout groove 10a formed when the conductive fuse 10 is blown out by laser light is filled with the second protection layer 11 after the laser trimming process is completed. Therefore, in the process of forming the plating electrode 12 performed thereafter, the fuse blowout groove 10a is not exposed to the plating solution. Therefore, nickel plating and reconnection do not occur in the blown out conductive fuse 10, and also the plating solution etc do not remain in the fuse blowout groove 10a, thereby enhancing the yield and reliability.

As described above, the third protection layer 13 that has a role of sealing and protecting the whole front surface of the semiconductor device need to have a large thickness. However, the second protection film 11, of which the main purpose is to fill a region including the fuse blowout groove 10a having a small area, is formed thinner than the third protection layer 13. In a case of a thin solder resist, the entire fluidity is higher than in a case of a thick solder resist, and the solder resist flows into a small recess portion with a narrow width more easily.

Therefore, the solder resist forming the thin second protection layer 11 has higher fluidity than the solder resist forming the thick third protection layer 13, and enters deep inside the fuse blowout groove 10a including the pores. Furthermore, as the area of the second protection layer 11 is smaller, the fluidity is higher and the solder resist enters the pores more easily. Therefore, it is preferable that the area of the second protection layer 11 is small but such that it covers the trimming element forming region 70, as shown in FIG. 3.

It is noted that the laser trimming process may be performed after the plating process in the post-process instead of in the front-end process. This change of the order of the processes prevents the reconnection etc of the blown out conductive fuse 10 in the fuse blowout groove 10a by the plating metal. In this case, too, it is preferable to form a protection layer by the thin second protection layer 11 filling the fuse blowout groove 10a and the thick third protection layer 13 covering the whole surface, as described above. This is to fill the pores with the second protection layer 11 enough as described above. In the embodiment, the conductive fuse is blown out by the laser trimming method, but the conductive fuse may be blown out by the electric current blowout trimming method.

The method of manufacturing the semiconductor device described above prevents a fuse blowout portion blown out by trimming from short-circuiting by a plating metal by electroless plating and prevents a plating solution etc from entering a trimming region, thereby enhancing the yield and reliability of the semiconductor device.

What is claimed is:

1. A method of manufacturing a semiconductor device comprising a conductive fuse for circuit characteristic adjustment in a trimming element forming region, comprising:

providing a semiconductor substrate;

forming a multilayered wiring structure of a polysilicon wiring and a plurality of metal wirings on a surface portion of the semiconductor substrate;

forming at least one conductive fuse in a portion of the multilayered wiring structure in the trimming element forming region;

forming a first protection layer having openings to expose a surface portion of an draw-out pad electrode being part of a topmost metal wiring of the multilayered wiring structure and to expose a portion of the trimming element forming region;

performing a trimming to blow out the conductive fuse through the opening of the first protection layer in the trimming element forming region;

forming a second protection layer covering the trimming element forming region after the trimming;

forming a plating electrode on the surface portion of the draw-out pad electrode exposed in the opening of the first protection layer by an electroless plating method after the second protection layer is formed; and forming a third protection layer comprising a solder resist on the semiconductor substrate so as to expose a portion of the plating electrode.

2. The method of claim 1, wherein the trimming is performed by laser.

3. The method of claim 1, wherein the trimming is performed by introducing electric flow in the fuse.

4. The method of claim 1, wherein the second protection layer covers the trimming element forming region only.

5. The method of claim 1, wherein the second protection layer is thinner than the third protection layer.

6. The method of claim 4, wherein the second protection layer is thinner than the third protection layer.

7. The method of claim 1, wherein the conductive fuse is part of the polysilicon wiring.

8. The method of claim 1, wherein the conductive fuse is part of the metal wiring.

9. The method of claim 1, wherein the second protection layer comprises a solder resist.

10. The method of claim 1, wherein the second protection layer comprises a silicon insulation film.

11. The method of claim 1, further comprising forming a bump electrode on the plating electrode exposed from the third protection layer.

12. A method of manufacturing a semiconductor device comprising a conductive fuse for circuit characteristic adjustment in a trimming element forming region, comprising:

providing a device intermediate of which circuit characteristic has been adjusted by blowing out the fuse, the device intermediate comprising a semiconductor substrate, a multilayered wiring structure of a polysilicon wiring and a plurality of metal wirings formed on a surface portion of the semiconductor substrate, at least one conductive fuse in a portion of the multilayered wiring structure in the trimming element forming region, and a first protection layer having openings to expose a surface portion of an draw-out pad electrode being part of a topmost metal wiring of the multilayered wiring structure and to expose a portion of the trimming element forming region, the conductive fuse being disposed in the opening of the first protection layer in the trimming element forming region and being blown out for circuit characteristic adjustment;

forming a second protection layer covering the trimming element forming region;

forming a plating electrode on the surface portion of the draw-out pad electrode exposed in the opening of the first protection layer by an electroless plating method after the second protection layer is formed; and forming a third protection layer comprising a solder resist on the semiconductor substrate so as to expose a portion of the plating electrode.

13. A method of manufacturing a semiconductor device comprising a conductive fuse for circuit characteristic adjustment in a trimming element forming region, comprising:

providing a semiconductor substrate;

forming a multilayered wiring structure of a polysilicon wiring and a plurality of metal wirings on a surface portion of the semiconductor substrate;

forming at least one conductive fuse in a portion of the multilayered wiring structure in the trimming element forming region;

forming a first protection layer having openings to expose a surface portion of an draw-out pad electrode being part of a topmost metal wiring of the multilayered wiring structure and to expose a portion of the trimming element forming region;

forming a plating electrode on the surface portion of the draw-out pad electrode exposed in the opening of the first protection layer by an electroless plating method;

performing a laser trimming to blow out the conductive fuse through the opening of the first protection layer in the trimming element forming region after the plating electrode is formed;

forming a second protection layer covering the trimming element forming region after the laser trimming; and forming a third protection layer comprising a solder resist on the semiconductor substrate so as to expose a portion of the plating electrode.

14. The method of claim 13, wherein the second protection layer covers the trimming element forming region only.

15. The method of claim 13, wherein the second protection layer is thinner than the third protection layer.

16. The method of claim 14, wherein the second protection layer is thinner than the third protection layer.

17. The method of claim 13, wherein the conductive fuse is part of the polysilicon wiring.

18. The method of claim 13, wherein the conductive fuse is part of the metal wiring.

19. The method of claim 13, wherein the second protection layer comprises a solder resist.

20. The method of claim 13, wherein the second protection layer comprises a silicon insulation film.

* * * * *